US005696491A

United States Patent [19]
White et al.

[11] Patent Number: 5,696,491
[45] Date of Patent: Dec. 9, 1997

[54] SELF-EXCITED MICROELECTROMECHANICAL DEVICE

[75] Inventors: Richard M. White; Seung Lee, both of Berkeley; James M. Bustillo, Castro Valley; Gregory A. Campbell, Pleasanton, all of Calif.

[73] Assignee: Regents of the University of California, Berkeley, Calif.

[21] Appl. No.: 476,622

[22] Filed: Jun. 7, 1995

[51] Int. Cl.[6] .................................................. G08B 21/00
[52] U.S. Cl. ...................... 340/657; 340/538; 310/316; 324/117 R; 324/126; 324/244
[58] Field of Search ............................ 310/316; 340/538, 340/657; 324/117 R, 126, 127, 244

[56] References Cited

U.S. PATENT DOCUMENTS

| | | | |
|---|---|---|---|
| 3,634,787 | 1/1972 | Newell | 333/72 |
| 3,983,477 | 9/1976 | Stachly et al. | 324/117 R |
| 4,232,265 | 11/1980 | Smirnov | 324/244 |
| 4,926,116 | 5/1990 | Talisa | 324/117 R |
| 5,264,831 | 11/1993 | Pfeiffer | 340/621 |
| 5,290,102 | 3/1994 | Kaiser et al. | 324/244 |
| 5,315,247 | 5/1994 | Kaiser et al. | 324/244 |
| 5,422,566 | 6/1995 | Boenning | 324/117 R |
| 5,442,288 | 8/1995 | Fenn et al. | 324/244 |

*Primary Examiner*—Thomas Mullen
*Assistant Examiner*—Timothy Edwards, Jr.
*Attorney, Agent, or Firm*—Flehr Hohbach Test Albritton & Herbert LLP; William S. Galliani

[57] ABSTRACT

A self-excited microelectromechanical device is described. The device includes a resonating structure, such as a cantilever, which responds to a physical phenomenon by generating an induced variable frequency voltage signal corresponding to the physical phenomenon. Self-excitation circuitry connected to the cantilever processes the induced variable frequency voltage signal and produces a variable frequency voltage signal in a resonant pass band of interest that is applied to the cantilever to augment the effect of the physical phenomenon on the cantilever. An exemplary use of the device is as a power line sensor. In this context, the cantilever responds to the electric field associated with a power signal on a power line. The cantilever transforms the voltage signal of the electric field into a corresponding frequency signal. The noise-immune frequency signal can be readily processed to reconstruct the power signals carried by the power line.

11 Claims, 11 Drawing Sheets

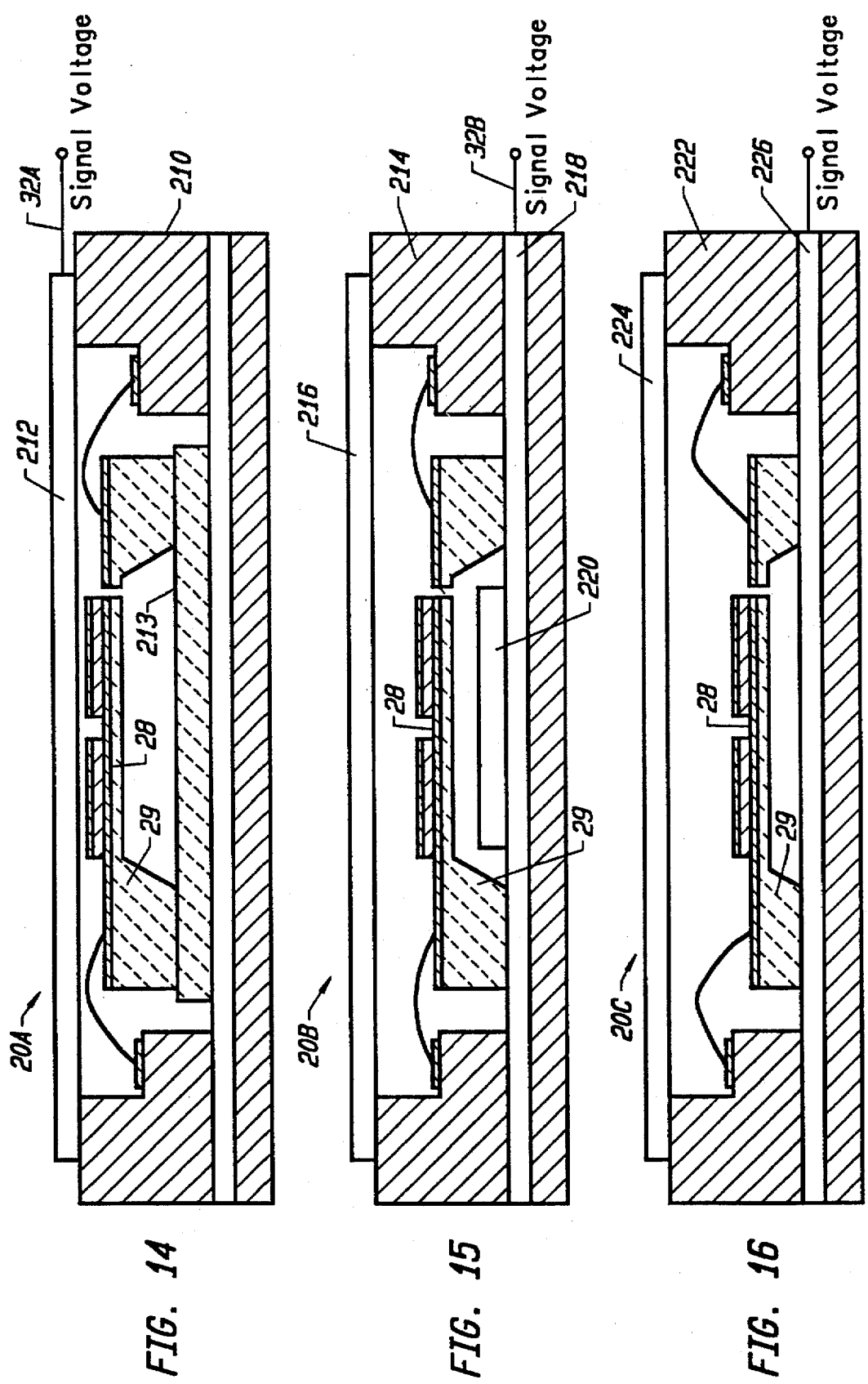

SELF-EXCITED MICROELECTROMECHANICAL DEVICE

BRIEF DESCRIPTION OF THE INVENTION

This invention relates generally to microelectromechanical devices, also known as micromachines. More particularly, this invention relates to a self-excited microelectromechanical device which operates as a voltage-to-frequency converter which can be used, for example, as a low-power sensor to monitor power signals on a power line.

BACKGROUND OF THE INVENTION

Microelectromechanical devices (also called micromechanical devices or micromachines) are small (micron scale) machines that promise to miniaturize instrumentation in the same way microelectronics have miniaturized electronic circuits. Microelectromechanical (MEM) devices have configurations analogous to conventional macroscale machinery, such as cantilevers, motors, and gear trains.

The present invention is related to MEM cantilever devices, and analogous resonating structures. It is known to use the deflection of a MEM cantilever device to measure physical phenomena, such as small mechanical pressure variations associated with sound. A patent application entitled "Cantilever Pressure Transducer", Ser. No. 08/072,294, filed Jun. 10, 1994, and assigned to the assignee of the present invention, discloses one such device.

It would be highly desirable to provide a MEM cantilever device with the capability of measuring different physical phenomena. Such a device would enable the exploitation of other benefits of MEM devices, such as their compactness and low power consumption.

If the structure of a MEM cantilever device was suitably improved, it could be used, for example, to reliably measure an electric field associated with a power line. This would potentially provide a compact and low-power power line sensor.

Electric utilities are interested in monitoring power parameters, such as current and voltage, along the length of powerlines. This information is useful in locating powerlines that have failed, are failing, or have some other undesirable attribute, such as arcing activity, voltage sag, momentary outage, improper loading, or poor "power quality" as evidenced by the presence of harmonics of the power line frequency.

Shortcomings associated with existing power line sensors make it difficult to provide comprehensive power line monitoring. Existing power line sensors are relatively expensive because they require insulation of the current or voltage transducers for the full electric potential of the power line. The insulation is expensive and bulky. In addition, existing sensors typically require a connection to ground, thereby necessitating a physical electrical connection from the power line to the ground. Consequently, existing power line sensors are inherently expensive, bulky, and expensive to install. It would be highly desirable to provide a power line sensor which could operate without the insulation and ground connection associated with prior art power line sensors. Such a device would be compact and relatively simple to install. Preferably, such a device would be inexpensive and have low maintenance requirements.

Improvements in power sensing are also desirable for watt and watt-hour meters at customer locations. It would be highly desirable to provide a compact, reliable, inexpensive solid-state power meter.

SUMMARY OF THE INVENTION

The invention is a self-excited microelectromechanical device. The device includes a resonating structure, such as a cantilever, which responds to a physical phenomenon by generating an induced variable frequency voltage signal corresponding to the physical phenomenon. The self-excitation circuitry causes the cantilever to vibrate at one of its resonant frequencies. This frequency is affected by the instantaneous electric force between an electrode on the cantilever and a nearby electrode.

An exemplary use of the self-excited cantilever device is as a power line sensor. In this context, the cantilever responds to an electric field associated with either the voltage waveforms or the current waveform on a power line. The cantilever transforms the electric field into a corresponding frequency signal. The noise-immune frequency signal can be readily transmitted and processed to reconstruct the voltage or current waveforms of the power line.

BRIEF DESCRIPTION OF THE DRAWINGS

For a better understanding of the nature and objects of the invention, reference should be made to the following detailed description taken in conjunction with the accompanying drawings, in which:

FIG. 14 illustrates an alternate embodiment of the self-excited microelectromechanical device of the invention.

FIG. 15 illustrates another alternate embodiment of the self-excited microelectromechanical device of the invention.

FIG. 16 illustrates still another alternate embodiment of the self-excited microelectromechanical device of the invention.

Like reference numerals refer to corresponding parts throughout the several views of the drawings.

DETAILED DESCRIPTION OF THE INVENTION

Figure 1:
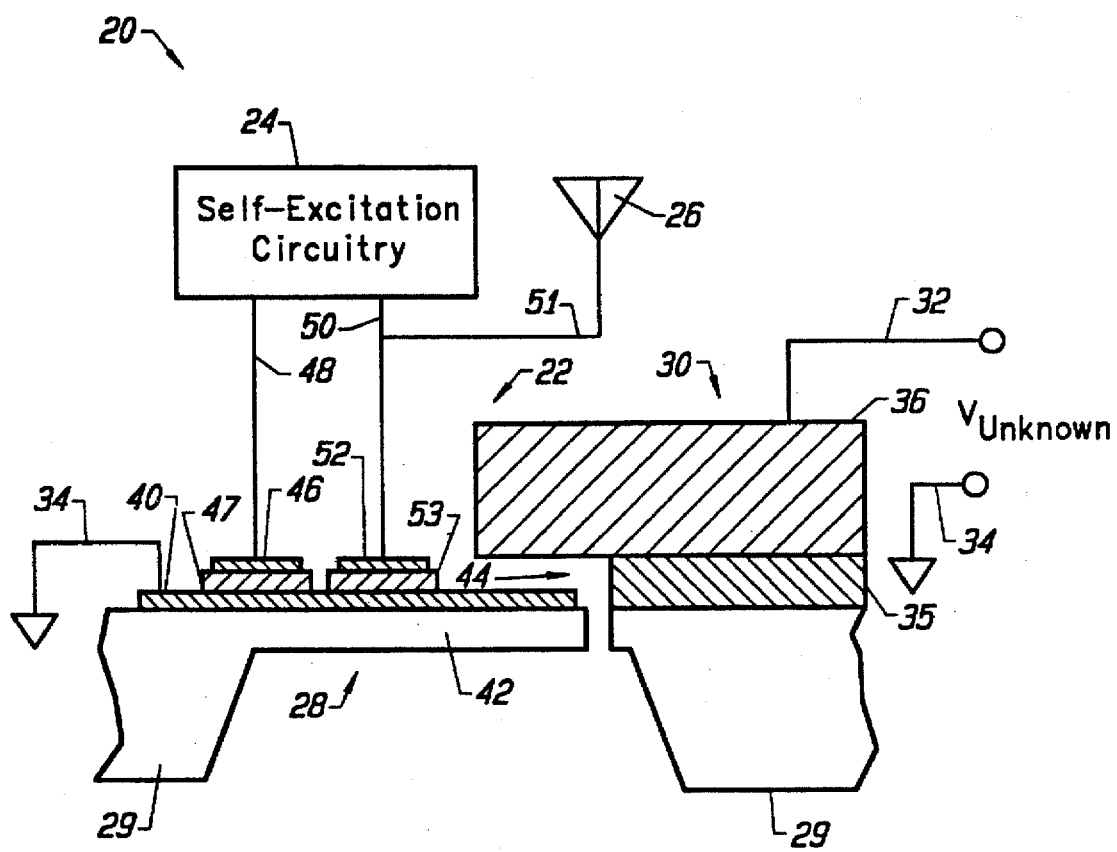
FIG. 1 illustrates one embodiment of the microelectromechanical device of the invention.

FIG. 1 illustrates one embodiment of the self-excited microelectromechanical (MEM) device 20 of the invention.

The self-excited MEM device 20 includes a MEM device 22, self-excitation circuitry 24, and an output device 26 (an antenna in this embodiment). The MEM device 22 includes a resonating structure. The resonating structure may be a cantilever 28 with an associated plate, shown as a MEM plate 30 in FIG. 1. The MEM plate 30 has a MEM plate input node 32 and a MEM plate common node 34. The MEM plate input node 32 is connected to an electrically conducting plate 36, which is positioned on a non-conducting spacer 35.

By way of example, the invention is disclosed in relation to its implementation as a power line sensor. In this context, a voltage (or current) waveform derived from the power line line-to-line voltage (or line current) is applied to the MEM plate input node 32. More particularly, as will be described below, the MEM plate input node 32 receives a voltage (or current) waveform from a field plate (or current coil). The MEM plate common node 34 is electrically the same as the cantilever common 40, which is electrically connected to the power line conductor.

The cantilever common 40 is positioned on a cantilever substrate 42. As shown in FIG. 1, the region between the cantilever 28 and the MEM plate 30 defines a device gap 44.

When a voltage signal (obtained from a field plate or a coil that couples magnetically to the power line current) is applied to the MEM plate input node 32, an electric field is induced in the device gap 44. This electric field deflects the tip of cantilever 28. Cantilever 28 is configured such that it is normally oscillating. In the exemplary embodiment described herein, the deflection of the cantilever tip by the electric field causes the resonant frequency of the cantilever 28 to change. In the context of an AC voltage signal, the resonant frequency of the cantilever 28 with no applied voltage will occur twice at the zero crossing of the applied signal each cycle. This reference point can be used for various calibration functions. Calibration functions can also be facilitated by placing an additional electrode on the cantilever. The additional electrode can monitor the electric field at the cantilever and make use of this information during calibration.

The MEM resonator of the invention, such as a cantilever 28, is self-excited by circuitry 24 so that the resonator oscillates at a resonant frequency. Cantilever 28 carries two separately defined electrodes 46 and 52. Electrode 46, together with ground plane 40 and piezoelectric layer 47, comprises a feedback transducer whose output voltage is led by feedback line 48 to self-excitation circuitry 24. The output of the self-excitation circuitry 24, an amplified variable frequency voltage signal, is applied to drive line 50, which is connected to a drive transducer defined by electrode 52, ground plane 40, and piezoelectric film 53. If the gain of the amplifier in circuitry 24 is appropriate, self-excited oscillation of the cantilever will result, and the oscillation frequency will be affected by the electric field existing in device gap 44.

The measurements made by the cantilever 28 may be processed by output device 26, which is connected to drive line 50 by output line 51. The output device 26 may be implemented in a number of manners. For example, the output device may be a micro-speaker with an amplifier that amplifies the sound generated by the oscillating cantilever 28. In this context, variations in sound from the cantilever correspond to frequency shifts in the oscillation of the cantilever, which correspond to variations in the voltage associated with the electric field in the device gap 44. The output device may also be implemented, for example, as an antenna. In this configuration, a variable frequency voltage signal can be applied directly to the antenna to electromagnetically induce a corresponding signal in a remotely positioned antenna.

Figure 2:
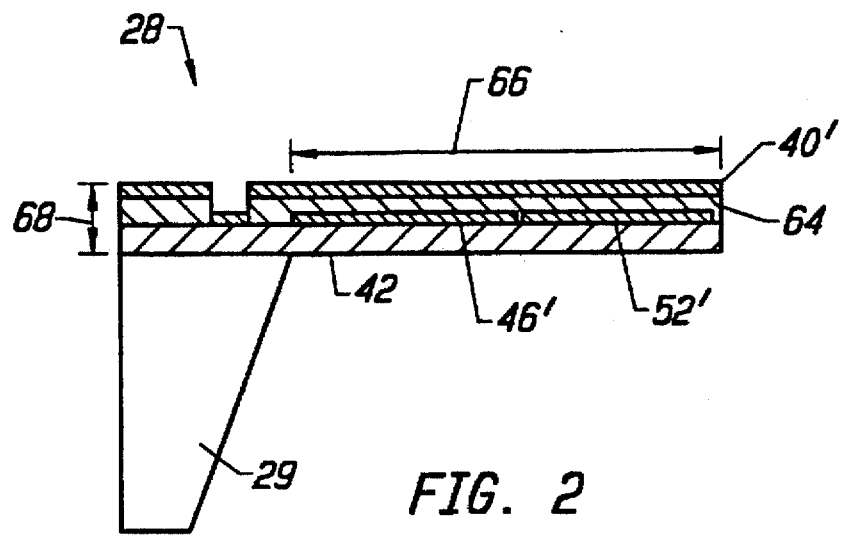
FIG. 2 is a side view of one embodiment of the microelectromechanical cantilever of the invention.

Attention now turns to FIG. 2, which illustrates a side view of a second embodiment of a cantilever 28 in accordance with the invention. The cantilever 28 may be implemented with a top metal layer forming ground plane 40' and a bottom metal layer forming electrode 46' and electrode 52' sandwiching a piezoelectric thin film 64. In one embodiment, the ground plane 40' was formed of 0.3 microns of aluminum, the piezoelectric thin film 64 was formed of 0.5 microns of zinc oxide, and electrode 46' and electrode 52' were formed of 0.2 microns of aluminum. In this embodiment, the cantilever substrate 42 was formed of 1.8 microns of low-pressure chemical-vapor-deposited (LPCVD) low-stress silicon nitride. Techniques for forming a device of this type are described in the patent application, assigned to the assignee of the present application, entitled "Cantilever Pressure Transducer", Ser. No. 08/072,294, filed Jun. 10, 1994, which is expressly incorporated by reference herein.

The foregoing dimensions result in a cantilever thickness, marked by arrow 68, of 2.8 microns. The implemented device of FIG. 2 had a length, marked by arrow 66, of 2000 microns. The width of the device, marked by arrow 70 of FIG. 3, was implemented as 2000 microns. This configuration resulted in a cantilever one of whose resonant frequencies fell between 12 and 14 kHz.

Figure 3:
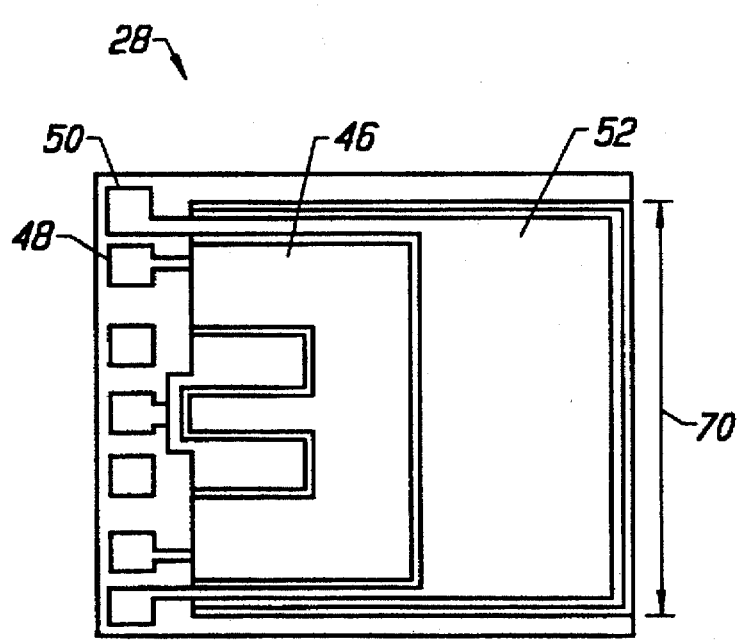
FIG. 3 is a top view of one embodiment of the microelectromechanical cantilever of the invention.

FIG. 3 is a top view of the cantilever 28, showing the top metal layer. The figure illustrates that the top metal layer may be configured to include a metal region forming electrode 46 connected to line 48. The top metal may also include a metal region forming electrode 52 connected to line 50. The bottom metal layer 40 is connected to node 34 (shown in FIG. 1).

The MEM plate 30 may be implemented from an electrically conducting plate 36 bonded to a non-conducting spacer 35 used to form device gap 44.

As previously indicated, the disclosed MEM device 22 is configured for a resonant frequency of between 12 and 14 kHz. Those skilled in the art will recognize a number of alternate configurations to achieve this resonant frequency and other resonant frequencies of interest.

Figure 4:
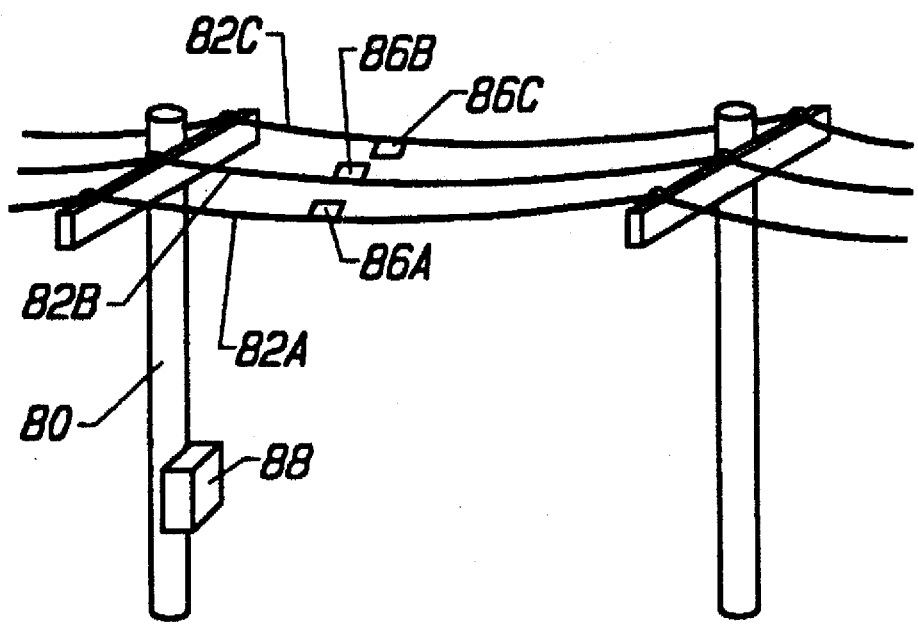
FIG. 4 is a perspective view of one embodiment of the microelectromechanical power line monitoring apparatus of the invention.

The self-excited MEM device 20 of the invention may be used in a variety of contexts, but by way of example, the device will initially be described as a power line sensor. FIG. 4 illustrates a power line pole 80 which supports powerlines 82A, 82B, and 82C. Connected to the powerlines are MEM power line attachment assemblies 86A, 86B, and 86C. Connected to the power line pole 80 is a MEM base station 88.

Figure 5:
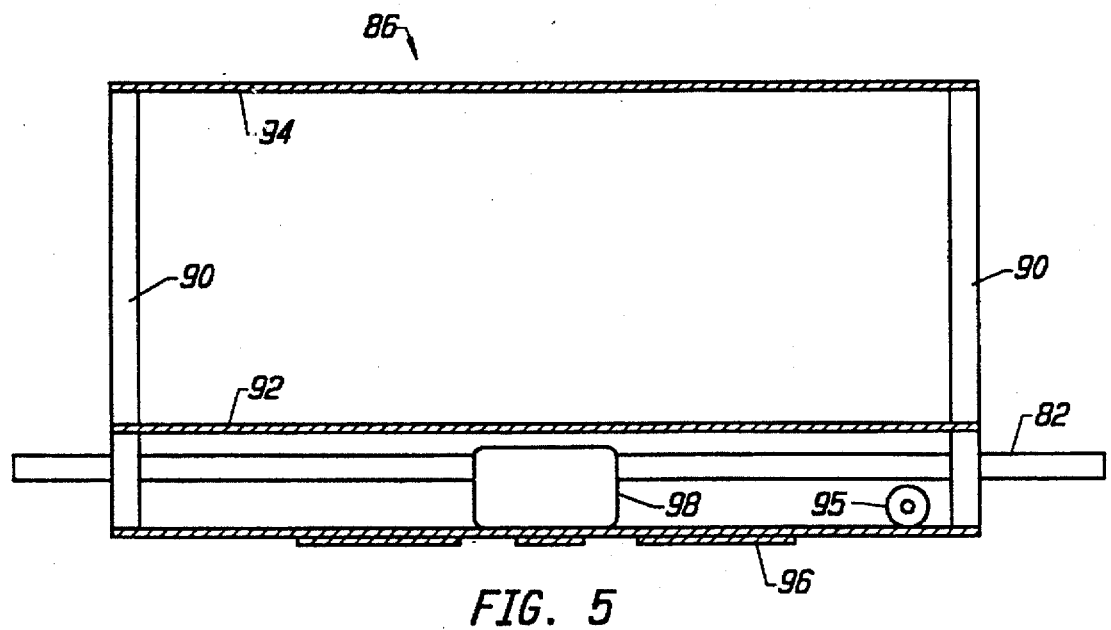
FIG. 5 is a top view of one embodiment of the microelectromechanical power line attachment assembly of the invention.

FIG. 5 is a top view of one embodiment of a MEM power line attachment assembly 86 in accordance with the invention. The assembly 86 includes a MEM power line system housing 90 that supports a first field plate 92 and a second field plate 94. Each field plate is a metallic plate which accumulates an electrostatic charge corresponding to its position in relation to the power line 82. As will be described below, the difference in electrostatic potential between field plate 92 and field plate 94 is used to generate an operating voltage that may be used by the self-excitation circuitry 24. Thus, the self-excitation circuitry 24 does not require a separate low-voltage power source, a great advantage in the power line context since it is difficult to provide and maintain a separate low-voltage power source on the power line 82.

An alternate approach is to power the sensor by using a coil 95 to couple to the magnetic field associated with the current on the power line. The problem with this approach is that the current drops as loads are served along the length of the power line. On the other hand, the electric field remains constant along the length of the power line.

FIG. 5 also illustrates that the MEM power line system housing 90 supports a connection mechanism 98 for electrical and physical connection to the power line 82. In addition, the MEM power line system housing 90 supports a printed circuit board 96.

Figure 6:
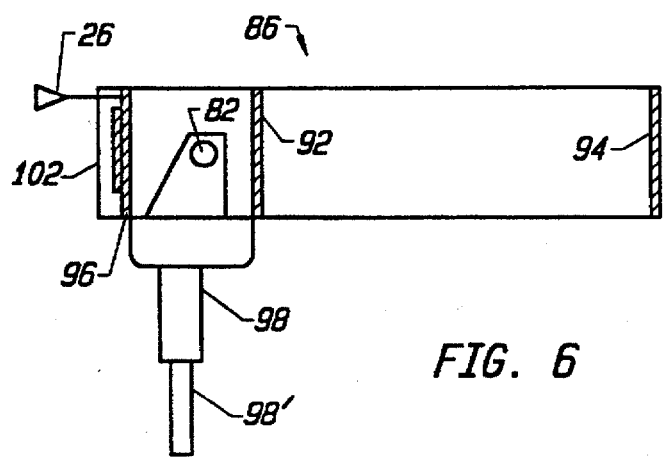
FIG. 6 is an axial view of the assembly of FIG. 5.

FIG. 6 is an axial view of the MEM power line attachment assembly 86. The connection mechanism 98 may be implemented with any widely known power line clamping device. Preferably, the connection mechanism 98 includes an extending region 98' with an aperture (not shown). As known in the art, the extending region 98' may be manipulated by a worker, or by a tool held by a worker, to position and lock the connection mechanism 98 onto the power line 82.

By way of example, the connection mechanism 98 may be formed of aluminum. A soft electrical conductor, such as a carbon motor brush may also be used for electrical connection to the power line. The advantage of this approach is that it will not damage the power line conductor and it will not lead to electrochemical corrosion effects. Protective grease may be used around the connection mechanism 98 to prevent corrosion in air.

FIG. 6 illustrates that a protective housing 102 may be used over the printed circuit board 96. In the embodiment of FIG. 6, the output device is implemented as an antenna 104.

Since the MEM attachment assembly 86 does not require a ground connection, it is relatively easy to install. The ease of installation is facilitated by the compact size of the components associated with the assembly 86. The assembly 86 is relatively inexpensive and maintenance free.

Figure 7:
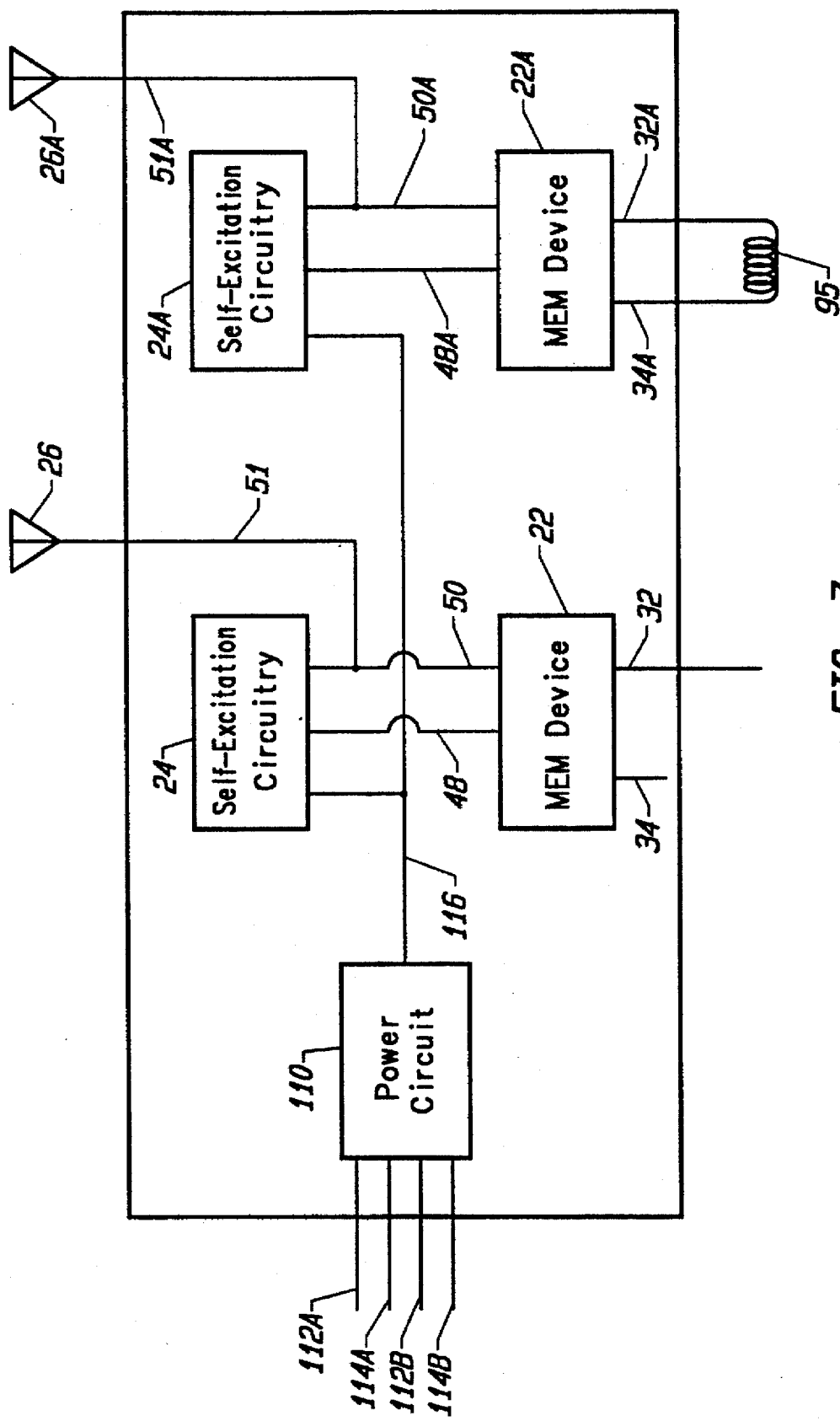
FIG. 7 is a schematic of one embodiment of the printed circuit board used in accordance with the microelectromechanical power line attachment assembly of the invention.

FIG. 7 illustrates a schematic of a printed circuit board 96 which may be used in the MEM power line attachment assembly 86. The board 96 includes the previously described MEM device 22, which may be housed in a standard integrated circuit housing. FIG. 7 illustrates the MEM plate input node 32 and the MEM plate common node 34 connections. The MEM plate common node 34 is electrically connected to the connection mechanism 98, while the MEM plate input node 32 is electrically connected to the first field plate 92. In a preferable embodiment, the first field plate 92 includes three electrically isolated metal regions. In such a configuration, one metal region is used to generate an electrostatic voltage input signal for input node 32, and the other metal regions are used to generate an electrostatic voltage input signal for the power circuit 110, as will be described below.

The connections between the self-excitation circuitry 24 and the MEM device 22 are the same as shown in FIG. 1. FIG. 7 illustrates a MEM device output line 51 connecting MEM device 22 and output device 26. As will be shown in relation to FIG. 8, the MEM device output line 51 may be connected to the drive line 50 from the self-excitation circuitry 24.

FIG. 7 illustrates a power circuit 110 with four input nodes. As indicated above, preferably field plate 92 includes three electrically isolated metal regions, two of which are used for the power circuit 110. In such a configuration, input nodes 112A and 112B would be respectively connected to the two metal regions. Input nodes 114A and 114B are respectively connected to two metal regions of field plate 94.

The power circuit 110 processes the voltage potential differences from the two sets of field plates to charge capacitors, whose voltage is used to power the self-excitation circuitry 24.

FIG. 7 illustrates a MEM device 22A connected to a coil 95. The coil 95 is positioned such that the circumferential magnetic field lines of the power line thread through the coil. A voltage proportional to the derivative of the current may then be obtained. Thus, the MEM device 22A may be used to process current information associated with the power signal on the power line. Instead of using a separate MEM device 22A, a switch can be used to apply the output of the coil 95 to the MEM device 22.

Figure 8:
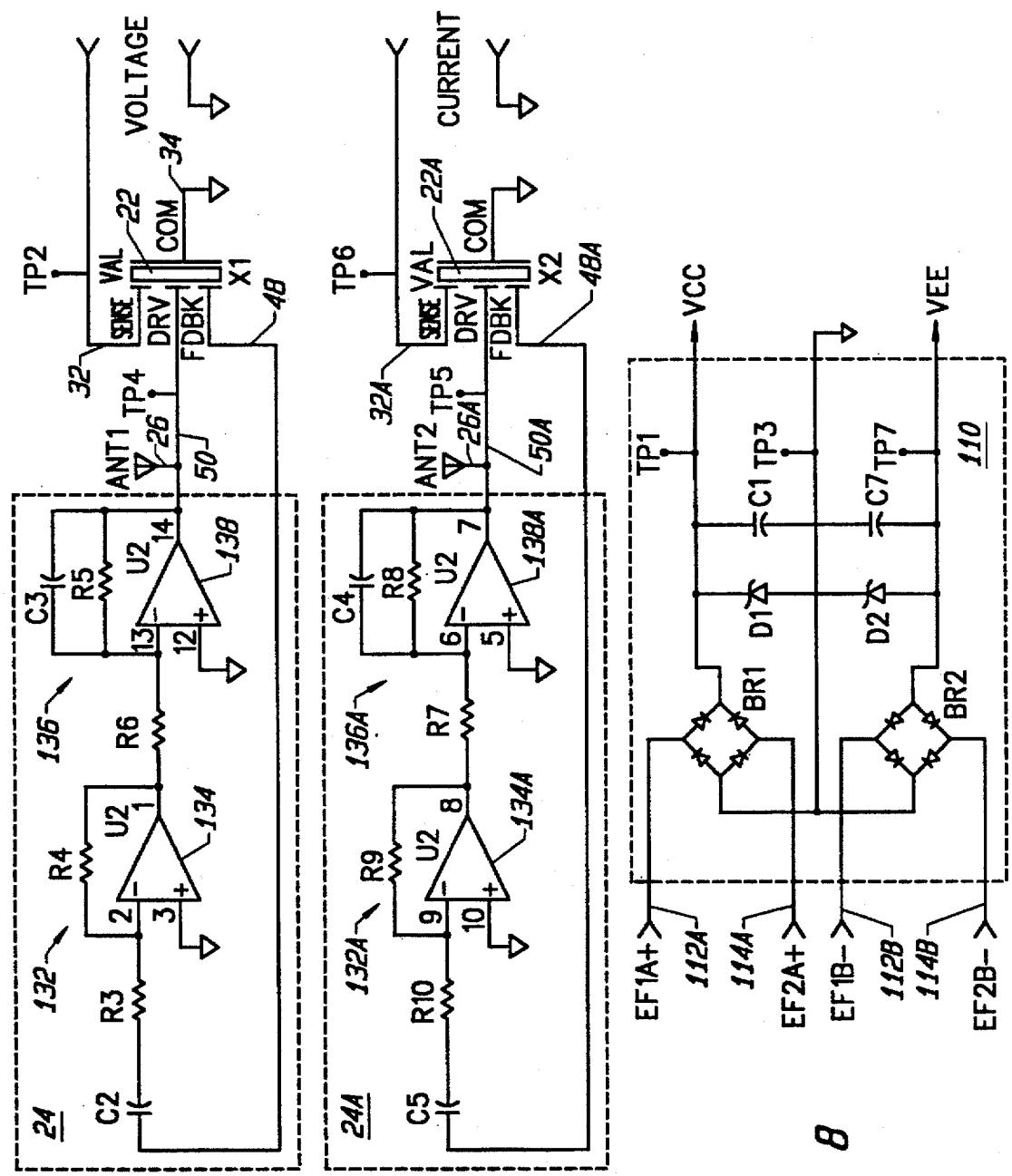
FIG. 8 is a detailed schematic of a number of the components of the device shown in FIG. 7.

FIG. 8 provides a detailed schematic of several of the components mounted on the printed circuit board 96. The top of the figure shows a voltage signal applied to the MEM plate input node 32. The top of FIG. 8 also shows the feedback line 48 connected between the MEM device 22 and the self-excitation circuitry 24. The self-excitation circuitry 24 of the embodiment of FIG. 8 includes a high-pass filter 132 and a low-pass filter 136, which in combination define a resonant frequency passband of interest. Note that the self-excitation of the cantilever 28 is achieved by simple and inexpensive amplifiers 134 and 138 and that the cantilever resonant frequency signal can be easily obtained from line 50.

The output of the self-excitation circuitry 24 is drive line 50, which is connected to MEM device 22. The drive line 50 also has an antenna 26 connected to it. In this embodiment, the antenna 26 serves as the output device. The antenna receives the variable frequency voltage signals produced by the MEM device. Typically, these signals will be in the range of ten to a few hundred kHz. The variable frequency voltage signals from antenna 26 are then passed to a remotely located antenna through electromagnetic induction. This direct coupling approach is highly advantageous because it eliminates undesirable power drains associated with modulators and other radio components.

FIG. 8 also illustrates a current signal applied to a MEM device 22A. The current signal is from coil 95. The remaining processing of the signal is as described in the previous paragraph.

Finally, FIG. 8 illustrates a power circuit 110. As shown, the power circuit 110 may be implemented as two full-wave rectifier circuits. The power circuit input nodes 112A and 112B are electrically connected to electrically isolated metal regions of the first field plate 92. The power circuit input nodes 114A and 114B are electrically connected to electrically isolated metal regions of the second field plate 94. These two pairs of input signals are rectified by the bridge circuits BR1 and BR2. The output current of approximately 60 microamperes from each set of field plates is used to charge capacitors C1 and C7. This charge may then be used by the amplifiers of the self-excitation circuitry 24 and 24A to induce self-oscillation in the cantilevers 22 and 22A.

The disclosed configuration has been used to derive approximately 500 microwatts from the electric field near a power line operating at 6 kilovolts. The self-excited MEM device of the invention only requires a few hundred microwatts to operate.

Figure 9:
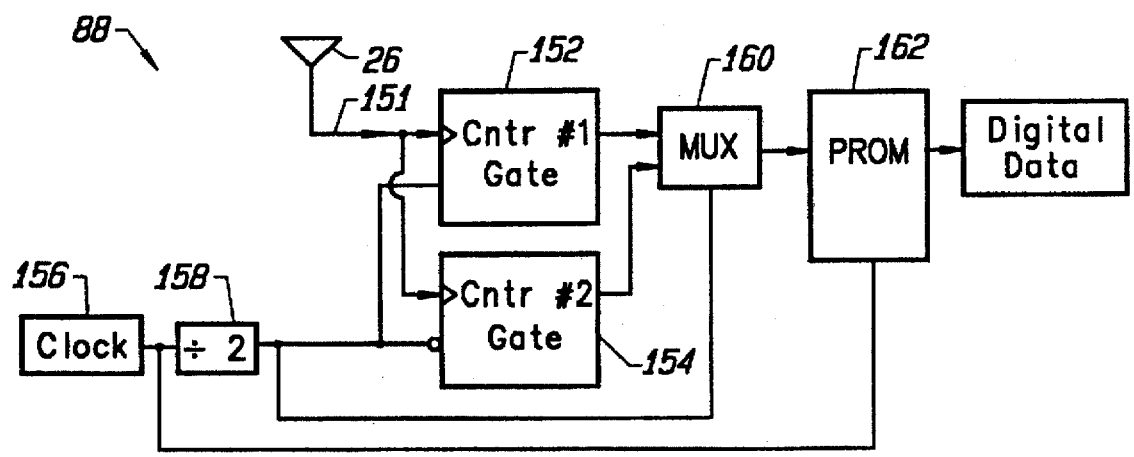
FIG. 9 is a schematic of one embodiment of the microelectromechanical base station of the invention.

Turning now to FIG. 9, illustrated therein is one embodiment of a MEM base station 88 which may be used in accordance with the invention. The MEM base station 88 includes an input device 150. The input device may be an antenna to receive the electromagnetic induction drive signal from an antenna on the MEM power line attachment assembly 86.

Figure 10:
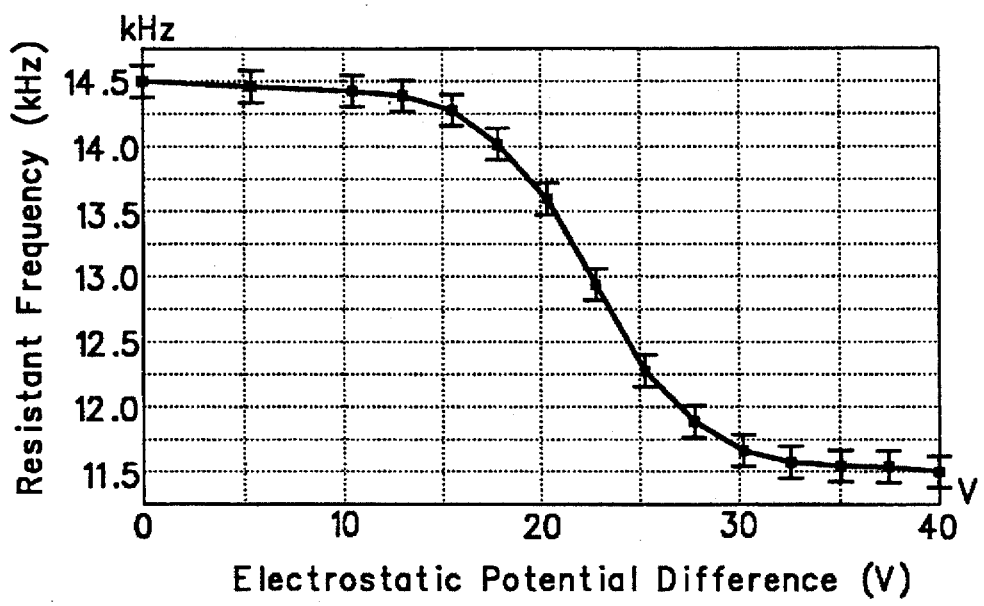
FIG. 10 illustrates voltage-to-frequency conversion values that may be used in accordance with the invention.

In either embodiment, the input device receives a time-varying frequency signal that is largely noise immune. The frequency of the signal is used to reconstruct the characteristics of the voltage and current waveforms of the power line. FIG. 10 illustrates the experimentally derived relationship between a resonant frequency value of a MEM device and the electrostatic field applied to the MEM device. In turn, the electrostatic field value has a known relationship with the line-to-line voltage or line current of the power line. Thus, the time-varying frequency signal from the MEM device 22 of the MEM power line attachment assembly 86 may be used by the MEM base station 88 to reconstruct the voltage and current waveforms of the power line. This data processing is conveniently performed at the base station 88 where an independent power supply is typically available.

The processing of the frequency signal into corresponding voltage and current waveforms of the power line may be performed in a variety of ways. One implementation is shown in FIG. 9. In the embodiment of FIG. 9, the signal is applied to a frequency processor which includes counters 152, 154, clock 156, divide-by-two circuit 158, and multiplexer 160. The signal at node 151 is applied in parallel to a first counter 152 and a second counter 154. The second counter 154 is toggled by an inverted clock signal from clock 156, while the first counter 152 is toggled by the clock signal. This allows one counter to operate while the other counter holds the accumulated count from the previous sample interval. The outputs of the counters are connected to a two channel multiplexer 160. The select line of the multiplexer is driven from the clock signal applied to the counter gates, making the accumulated count of the previous sample interval available at the output of the multiplexer 160.

The output of the multiplexer 160 may be connected to the address lines of a programmable read-only memory (PROM) 162 which serves as a conversion circuit. The output enable control line of the PROM 162 is connected to the clock 156. Through the operation of the divide-by-two circuit 158A, appropriate settling time of the data applied to the address input lines of the programmable read-only memory 162 is provided before the data output lines are enabled.

The output of the PROM is digital data which reconstructs the sensed power signal. In other words, the variable frequency voltage signal results in a digital address signal. The digital address signal accesses information in the PROM 162 defining the power line signal. For example, the frequency signal accesses a voltage signal derived from the electric field that is proportional to the line-to-line voltage of the power line. This information can then be transmitted to a central computing area for comprehensive monitoring of a power line. In the alternative, the information can be stored for subsequent processing. In another embodiment, the information can be compared to a set of predetermined threshold values. If the comparison identifies a problem, a visual or audio alarm may be activated at the MEM base station 88, or an alarm signal may be sent to the power system control center.

The data mapping provided by the PROM 162 can be used to provide calibration data for the MEM device 22. Since the PROM 162 provides a one-to-one mapping from the applied address to the data output, complex calibration calculations can be done once during calibration and embedded in the PROM 162, rather than being calculated in real-time.

The PROM 162 can also be programmed with a more involved data mapping. For example, if the signal voltage is known to be sinusoidal and RMS values of the voltage are required, the PROM 162 can be programmed with the RMS value of the sinusoidal signal. A simple digital system can then monitor the digital data stream and store the peak values. This will provide real-time RMS voltage data without requiring multiplications.

When voltage and current are monitored by the MEM power line attachment assembly 86, the MEM base station 88 can be used as a watt or watt-hour meter. In this embodiment, the output of the voltage and current signals is combined to generate the address applied to the PROM 162. The data contained in the PROM 162 would then be the power (watts) of the applied voltage and current or the energy consumed over the sample interval (watt-hours).

Figure 11:
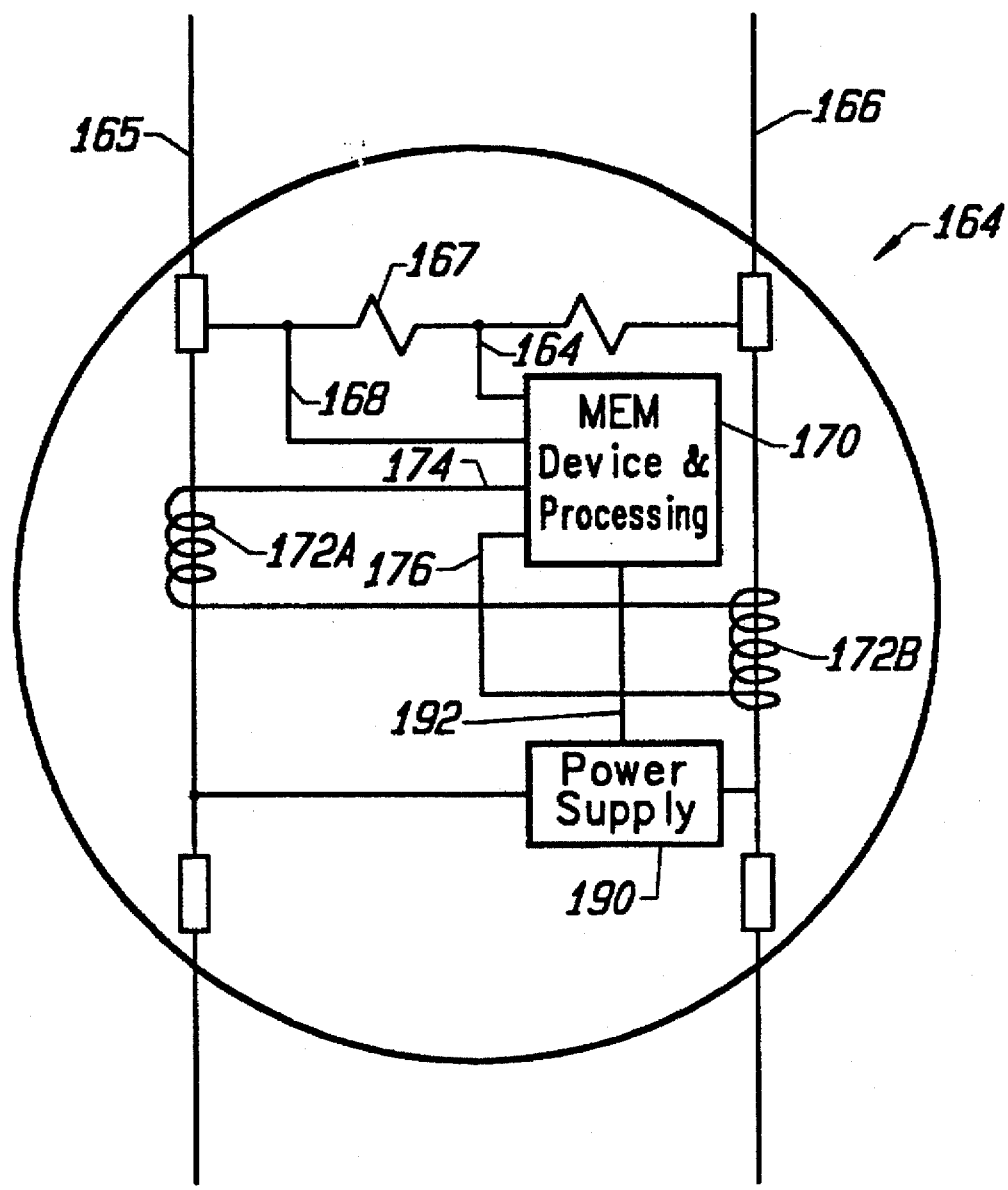
FIG. 11 is a power meter that may be used in accordance with the invention.

FIG. 11 illustrates one feasible embodiment of a watt or watt-hour meter in accordance with the invention. The meter 164 of FIG. 11 is connected to a feeder line 166 and a feeder line 165, which receives stepped-down voltage from a power line (not shown). A resistor network 167 is used as a voltage divider. Nodes 168 and 169 respectively apply a scaled voltage from the resistor network 167 to MEM device and processing circuitry 170.

The meter 164 also includes a coil 172 positioned around feeder line 165 and feeder line 166, the output of which is applied to the MEM device and processing circuitry 170 via nodes 174 and 176.

The meter 164 also includes a power supply 190 to energize the MEM device and processing circuitry 170. The power supply 190 may include a step-down transformer and a rectifier.

Figure 12:
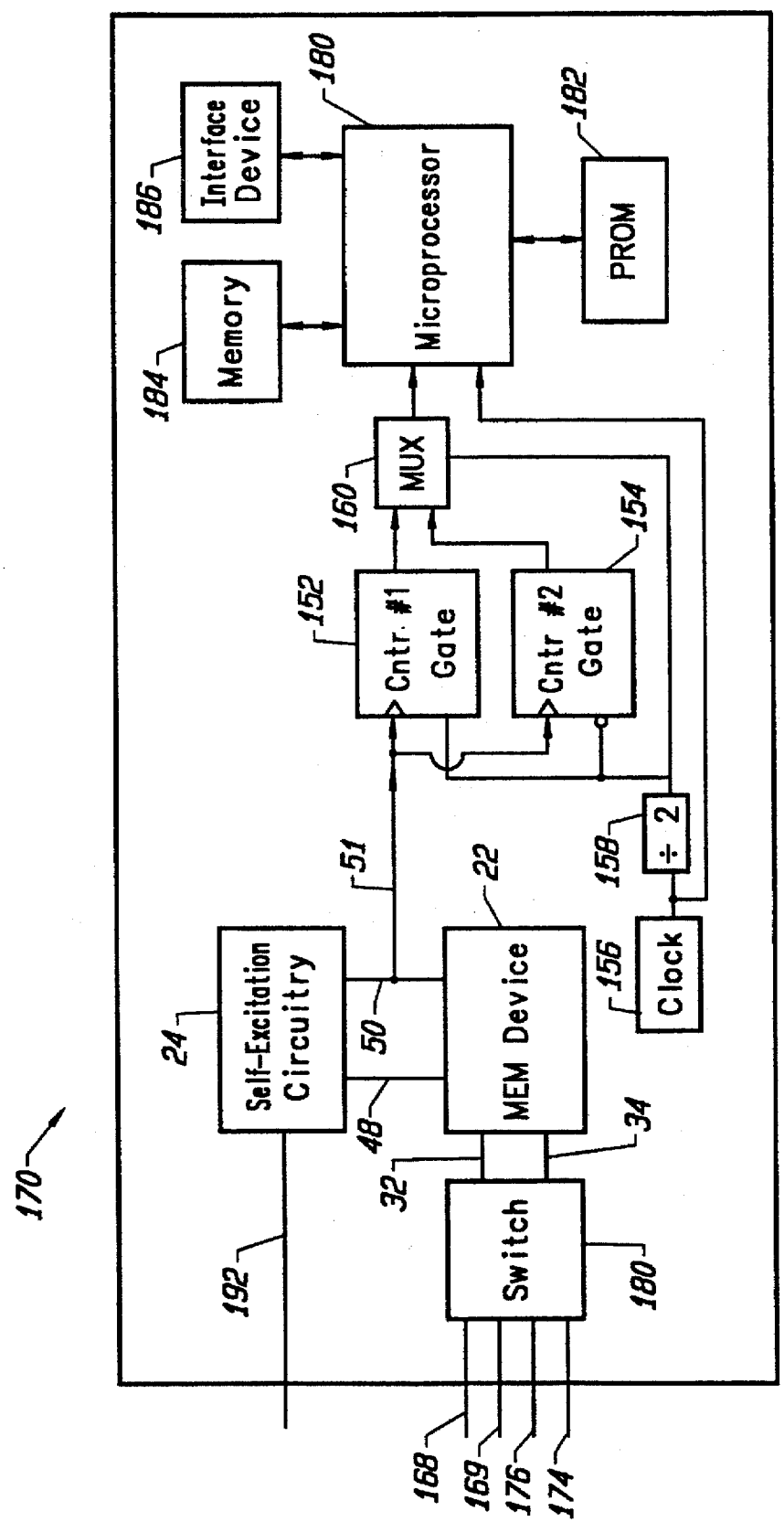
FIG. 12 illustrates a MEM device and processing circuitry that may be used in the power meter of claim 11.

FIG. 12 illustrates one embodiment of the MEM device and processing circuitry 170. In this embodiment, a switch 180 is used to apply the signals from nodes 168 and 169 to MEM device 22 and then to apply the signals from nodes 176 and 174 to MEM device 22. This configuration allows just one MEM device 22 to be used. However, a more accurate configuration incorporates two MEM devices 22 and eliminates switch 180.

The operation of the MEM device 22, self-excitation circuitry 24, counters 152 and 154, clock 156, divide-by-two circuit 158, and multiplexer 160 operate as described above. The output of the multiplexer 160 is applied to a microprocessor 180, which combines the incoming frequency information relating to the feederline current and voltage to obtain an address for PROM 182. The PROM 182 stores frequency-to-watt conversion information that is accessed by the microprocessor 180. The resultant watt information may be combined with time interval information to obtain watt-hour information. The watt information and watt hour information may be stored in memory 184. In addition, the power information may be passed to interface devices 186, which may include a visual display of the information. The interface devices 186 may also include wire feeds, radio feeds, etc. to a central computer responsible for processing metering information.

Figure 13:
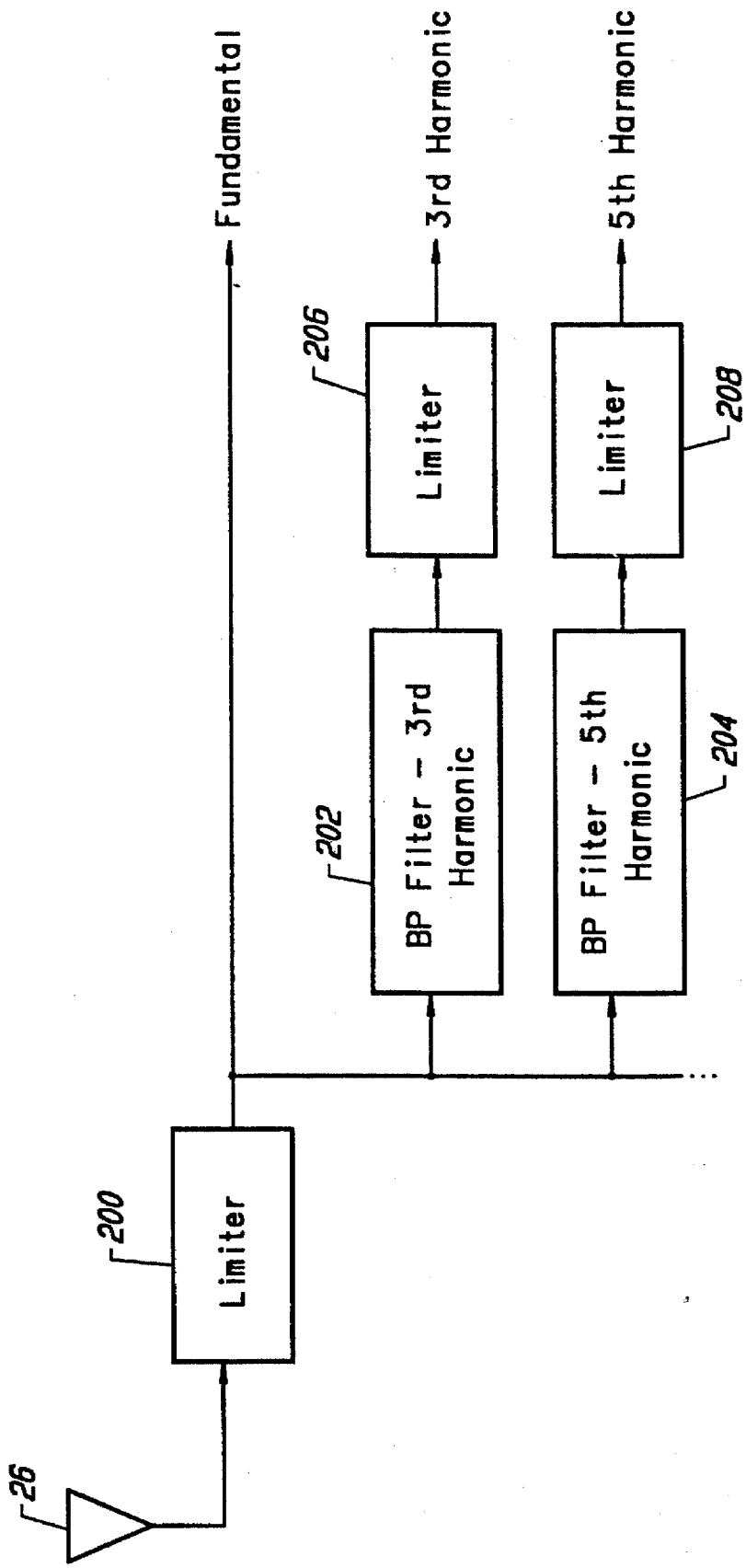
FIG. 13 is a schematic block diagram of a measurement resolution enhancement device which may be used in accordance with the invention.

FIG. 13 illustrates a signal resolution circuit that may be used at the front end of the MEM base station 88, shown in FIG. 9. The resolution of the self-excited MEM device 20 of the invention is a function of the magnitude of the frequency shift for a given applied voltage. The greater the frequency shift, the more accurately the applied voltage signal can be estimated. In the apparatus of FIG. 13, the variable frequency voltage signal from the input device 150 is converted from a sinusoidal signal into a rectangular wave with a limiter 200, a known device. This results in the creation of odd harmonics of the fundamental frequency which can be recovered with band pass (BP) filters 202 and 204. The odd harmonic signals may be processed by limiters 206 and 208. One or more of the odd harmonic signals may then be applied to input node 151 of the processing circuitry of FIG. 9.

An important feature of the harmonic signals is that the higher the harmonic, the greater the signal resolution because of the increase in frequency change over the fundamental signal. A cantilever voltage-to-frequency converter in accordance with the invention may have a resonant frequency that varies from 15 kHz to 10 kHz with an applied signal voltage of 0V to 10V. This results in a change in frequency of approximately 500 Hz per applied volt. The 3rd harmonic of this signal will vary from 45 kHz to 30 kHz for the same applied voltage of 0V to 10V. This will result in a change in frequency of approximately 1500 Hz per applied volt, a threefold increase in resolution, provided the noise is constant.

FIG. 14 illustrates an alternate embodiment of the self-excited microelectromechanical device 20A of the invention. The cantilever 28 is positioned on a shim 213 within a housing 210. This embodiment of the device does not have a MEM plate 30, as shown in FIG. 1. Instead, a metallic plate lid 212 is provided on the housing 210. The MEM plate input node 32 of FIG. 1 is substituted with a plate input node 32A, which receives the signal from the power line or other signal to be measured. A plate common node 34A is connected to the cantilever common 40, as previously described. The operation of the resultant electric field on the cantilever 28 is as previously described.

FIG. 15 illustrates another embodiment of the invention which does not require a MEM plate 30. In this embodiment, the cantilever 28 is positioned within package 214. The package 214 includes a metallic plate base 218 with an electrically conducting spacer 220 protruding toward the cantilever 28. In this configuration, the plate input node 32B connected to the metallic plate base 218 receives the signal to be measured. The electrically conducting spacer 220, by virtue of its connection to metallic plate base 218, creates an electric field which deflects the cantilever 28, as previously described.

The embodiment of FIG. 16 is similar to that of FIG. 15, but it does not include the spacer 220. Instead, the cantilever support frame 29 is thinned so that the cantilever is closer to the metallic plate base 226.

The self-excited MEM devices 20 of the invention may be used to monitor such physical phenomena as temperature or moisture. That is, the frequency oscillation of the cantilever will vary in an empirically determinable way in the presence of changing temperature or moisture. Thus, it may be desirable to provide an extra self-excited MEM device 20 on a MEM power line attachment assembly to monitor the temperature of the conductor. This temperature information can be used to monitor physical line sag or to correct the other measured power line parameters, such as shaking of the conductor.

Those skilled in the art will recognize a number of benefits associated with the invention. The self-excited MEM device 20 provides enhanced sensitivity in the measurement of a variety of physical phenomena. When implemented to measure an electric field, for example as a power line monitor, the device of the invention allows for a compact configuration that is powered solely from the electric fields surrounding the power line. Thus, the device is relatively inexpensive, easy to install, and has low maintenance requirements. When implemented in a power meter, the self-excited MEM device 20 allows for a compact, reliable, inexpensive solid-state power meter.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A microelectromechanical device, comprising:

a resonating structure which responds to a physical phenomenon by resonating at a resonant frequency, said resonating structure producing a variable frequency voltage signal corresponding to said resonant frequency; and self-excitation circuitry connected to said resonating structure to process said variable frequency voltage signal and induce said resonating structure to resonate in a resonant pass band of interest;

wherein said resonating structure is a cantilever and said microelectromechanical device further comprises a plate positioned adjacent to said cantilever so as to define a device gap therebetween; and wherein a voltage is applied to said plate, thereby generating an electric field in said device gap that alters the mechanical forces on said cantilever to produce said variable frequency voltage signal.

2. The microelectromechanical device of claim 1 wherein said cantilever includes a piezoelectric thin film positioned between a top metal layer and a bottom metal layer.

3. The microelectromechanical device of claim 2 wherein said top metal layer includes a first electrode and a second electrode, and said bottom metal layer operates as an electrical common.

4. The microelectromechanical device of claim 2 wherein said bottom metal layer includes a first electrode and a second electrode, and said top metal layer operates as an electrical common.

5. The microelectromechanical device of claim 1 wherein a feedback electrode of said resonating structure electrically connects an input signal to said self-excitation circuitry and said self-excitation circuitry produces an output signal that is electrically connected to a drive electrode of said resonating structure.

6. The microelectromechanical device of claim 1 wherein said resonating structure includes a calibration electrode.

7. The microelectromechanical device of claim 1 wherein said self-excitation circuitry includes a high-pass filter and a low-pass filter to limit said variable frequency voltage signal to said resonant frequency pass band of interest.

8. A microelectromechanical device, comprising:

a resonating structure which responds to an electric field by resonating at a resonant frequency, said resonating structure producing a variable frequency voltage signal corresponding to said resonant frequency;

self-excitation circuitry connected to said resonating structure to process said variable frequency voltage signal and induce said resonating structure to resonate in a resonant pass band of interest; and a package enclosing said resonating structure, said package including a metal portion to receive an input signal and induce said electric field adjacent to said resonating structure and thereby generate said variable frequency voltage signal.

9. The microelectromechanical device of claim 8 wherein said metal portion is incorporated into a lid for said package.

10. The microelectromechanical device of claim 8 wherein said resonating structure is positioned on said metal portion.

11. The microelectromechanical device of claim 8 wherein said metal portion includes an electrically conducting spacer extending toward said resonant structure.

* * * * *